United States Patent
Akagi (10) Patent No.: US 9,012,930 B2
(45) Date of Patent: Apr. 21, 2015

(54) SEMICONDUCTOR LIGHT EMITTING DEVICE PROVIDING GRADED BRIGHTNESS

(71) Applicant: Stanley Electric Co., Ltd., Meguro-ku, Tokyo (JP)

(72) Inventor: Takanobu Akagi, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 14/025,753

(22) Filed: Sep. 12, 2013

(65) Prior Publication Data

US 2014/0070254 A1 Mar. 13, 2014

(30) Foreign Application Priority Data

Sep. 13, 2012 (JP) ................. 2012-201774

(51) Int. Cl.
| | |
|---|---|
| H01L 29/18 | (2006.01) |
| H01L 33/58 | (2010.01) |
| H01L 33/00 | (2010.01) |
| H01L 33/02 | (2010.01) |
| H01L 33/10 | (2010.01) |

(52) U.S. Cl.
CPC ............ *H01L 33/58* (2013.01); *H01L 33/0095* (2013.01); *H01L 33/02* (2013.01); *H01L 33/10* (2013.01)

(58) Field of Classification Search
CPC ...... H01L 33/58; H01L 33/02; H01L 33/0095
See application file for complete search history.

(56) References Cited

U.S. PATENT DOCUMENTS

| | | | |
|---|---|---|---|
| 2007/0029560 A1* | 2/2007 | Su | ................................... 257/98 |
| 2012/0051079 A1* | 3/2012 | Saito et al. | ..................... 362/538 |

FOREIGN PATENT DOCUMENTS

| | | |
|---|---|---|
| JP | 2010-056458 A | 3/2010 |
| JP | 2012-059523 A | 3/2012 |

\* cited by examiner

*Primary Examiner* — Benjamin Sandvik
*Assistant Examiner* — Farid Khan
(74) *Attorney, Agent, or Firm* — Holtz, Holtz, Goodman & Chick PC

(57) ABSTRACT

A semiconductor light emitting device includes a semiconductor lamination including a p-type semiconductor layer, an active semiconductor layer, and an n-type semiconductor layer; opposing electrode structure including a first electrode structure formed above the p-type semiconductor layer, and a second electrode structure formed above the n-type semiconductor layer; and brightness grade producing structure including a surface layer of at least one of the p-type semiconductor layer and the n-type semiconductor layer and producing brightness grade gradually changing from one edge to opposite edge of light output plane.

8 Claims, 9 Drawing Sheets

FIG. 9

SEMICONDUCTOR LIGHT EMITTING DEVICE PROVIDING GRADED BRIGHTNESS

CROSS REFERENCE TO RELATED APPLICATION

This application is based on and claims priority of Japanese patent application 2012-201774, filed on Sep. 13, 2012.

FIELD OF THE INVENTION

This invention relates to a semiconductor light emitting device and its manufacture.

RELATED ART

Nitride semiconductor light emitting diodes (LED) such as GaN diodes can emit ultraviolet or blue lights. By utilizing fluorescent material or phosphor, these LED's can emit white lights. White light emitting LED's are used, for example, for illumination or head light for vehicles.

Generally, sapphire is used as growth substrate for nitride semiconductor layers. Sapphire is an insulator and hence, when the sapphire substrate exists, n-side and p-side electrodes should be formed on the grown layers. Sapphire has a relatively low thermal conductivity, and is relatively poor in heat transfer. Recently, development has been done to remove the sapphire growth substrate by laser lift off (LLO) or polishing. When the sapphire substrate is removed, an n-type layer and a p-type layer can be exposed, and an n-side electrode and a p-side electrode can be formed thereon.

Techniques of forming brightness distribution in the output lights from an LED have been developed (for example, see JP-A 2012-059523). Brightness distribution for head light of an automobile is arranged in such configuration that brightness is at a constant value in horizontal direction, and gradually decreases from lower side to upper side in vertical direction.

SUMMARY OF THE INVENTION

Embodiments are intended to provide a semiconductor light emitting device which produces brightness grade or inclination in one direction. The brightness may be kept constant in a direction perpendicular to the one direction.

A semiconductor light emitting device includes a semiconductor lamination including a p-type semiconductor layer, an active semiconductor layer, and an n-type semiconductor layer; opposing electrode structure including a first electrode structure formed above the p-type semiconductor layer, and a second electrode structure formed above the n-type semiconductor layer; and brightness grade producing structure including a surface layer of at least one of the p-type semiconductor layer and the n-type semiconductor layer and producing brightness grade gradually changing from one edge to opposite edge of light output plane.

A method for manufacturing a semiconductor light emitting device capable of emitting lights with brightness grade includes growing a semiconductor lamination on a growth substrate, the semiconductor lamination including a p-type semiconductor layer, an active semiconductor layer, and an n-type semiconductor layer; forming brightness grade producing structure including a surface layer of at least one of the p-type semiconductor layer and the n-type semiconductor layer and producing brightness grade gradually changing from one edge to opposite edge of light output plane; and forming opposing electrode structure including a first electrode structure formed above the p-type semiconductor layer, and a second electrode structure formed above the n-type semiconductor layer.

The object and advantages of the invention will be realized and attained by means of the elements and combinations particularly pointed out in the claims.

It is to be understood that both the foregoing general description and the following detailed description are exemplary and are not restrictive of the invention, as claimed.

DESCRIPTION OF THE PREFERRED EMBODIMENTS

Figure 1A:
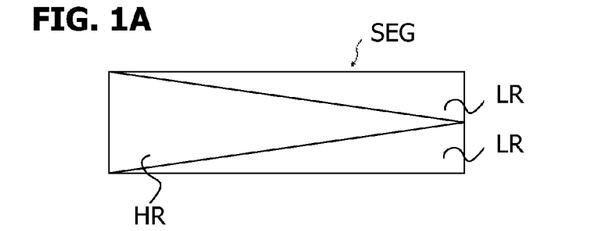
FIG. 1A is a schematic diagram of a segment to be formed in light emitting plane.

FIG. 1A is a schematic plan view of a light emitting segment. In a horizontally long rectangular light output segment SEG, there are formed a triangular high resistivity region HR which has a height gradually decreasing from the left side to the right side, and a pair of triangular low resistivity regions LR sandwiching the high resistivity region HR from the upper and lower sides, each of the low resistivity regions LR having a height gradually increasing from the left side to the right side. The high resistivity region HR has significantly higher resistivity than that of the low resistivity region LR. The height of one segment SEG is set small, and a plurality of segments will be stacked in vertical direction in the figure to produce horizontal resistance distribution gradually decreasing from the left side to the right side in the figure.

Figure 1B:
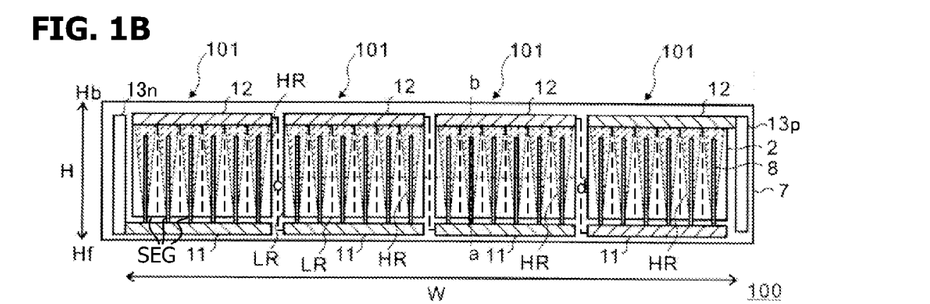
FIGS. 1B, 1C, and 1D are a plan view, an equivalent circuit diagram, and a cross section of an LED.

FIG. 1B is a plan view of a light emitting diode (LED) array 100 including four semiconductor light emitting (LED) elements 101 formed on a support substrate 10 such as a silicon substrate formed with an insulating film such as silicon oxide film, and connected in series. In this figure, segment SEG as illustrated in FIG. 1A is oriented vertically, and a multiplicity of vertically long segments SEG are stacked and aligned in horizontal direction. Low resistivity regions LR of adjacent segments will be combined to form one low resistivity region LR. The detailed structure and the manufacture thereof will be described later.

Figure 1C:
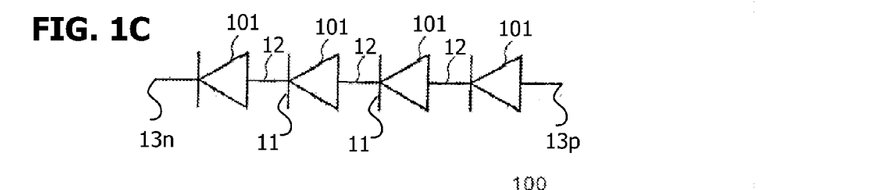

FIG. 1C is an equivalent circuit diagram of the four LED elements in the LED array 100. Four LED elements 101 are connected in series. The n-side electrode 11 of the LED element 101, except the leftmost one, is connected to the p-side electrode of the left side adjacent LED element 101, and the n-side electrode 11 of the leftmost LED element is connected to the n-side current supply pad 13n. The p-side electrode 12 of the rightmost LED element 101 is connected to the p-side current supply pad 13p.

Figure 1D:
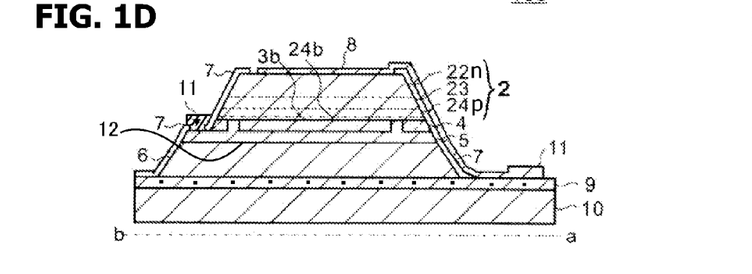

FIG. 1D is schematic cross section of basic structure of an LED element 101 along linear segment ab depicted in FIG. 1B. Each of the LED elements 101 includes a GaN series light emitting portion (device structure lamination) 2 including an n-type GaN layer 22, an active layer 23, and a p-type GaN layer 24. The term "GaN series" means alloy or mixed crystal system of AlGaInN. The LED element further includes a p-side electrode 12 formed on a rear surface of the p-type GaN layer 24 and exposed along a first lengthwise side of the device structure lamination 2.

An insulating film 7 made of silicon oxide is formed on the LED islands including the device structure lamination 2, for protecting the surface. Openings are formed in the insulating film 7 on the upper surface of the n-type GaN layer 22 and on a stripe region of p-side electrode 12 outside the device structure lamination 2. An n-side common electrode 11 is disposed in parallel with and spaced at a constant distance from a second lengthwise side opposite to the first lengthwise side of the LED element 101.

A plurality of contact and wiring electrodes 8 are disposed on a front surface of the n-type GaN layer 22 and on the insulating layer 7 in parallel with the short side of the device structure lamination 2, and connected to the n-side common electrode 11. The assembly of the contact and wiring electrodes 8 and the n-side common electrode 11 may have saw tooth shape as illustrated in FIG. 1B.

As illustrated in FIG. 1D, a reflecting metal electrode 3 made for example of Ag or Ag alloy is formed on the rear surface of the p-type GaN layer 24. Lights downwardly proceeding from the active layer 23 will be reflected upward by the reflecting metal electrode 3. An etch stopper layer 4 made for example of silicon oxide is formed on a peripheral portion of the p-type GaN layer 24 surrounding the reflecting metal electrode 3. The etch stopper layer 4 serves as an etch stopper in etching for isolating the respective LED elements. A first adhesion metal layer 5 is formed above the p-type GaN layer 24, covering the reflecting metal electrode 3 and the etch stopper layer 4. The reflecting metal electrode 3 and the adhesion metal layer 5 constitute a p-side electrode 12. The n-side electrode 11 of adjacent LED element extends on the p-side electrode 12 exposed in the opening.

The number of LED elements in the array is not limited to four, and may be increased or decreased according to necessity. The connection of the LED elements is not limited to a single series connection. For obtaining a high output power, it is preferable to assemble a plurality of LED elements. They may be connected in series, in parallel, or in parallel and series, or in other configurations.

The respective LED elements may be shaped in horizontally long rectangular, vertically long rectangular, or square shape. The contact and wiring electrode 8 may have ladder shape, lattice shape, radial shape, or other shapes, as well as the comb tooth shape.

Figure 2A:
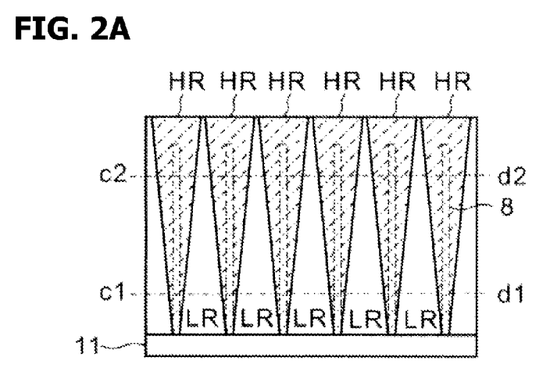
FIGS. 2A, 2B, and 2C are a plan view and cross sections of an LED having distributed low resistivity regions LR and high resistivity regions HR, which produce brightness grade or inclination.
Figure 2B:
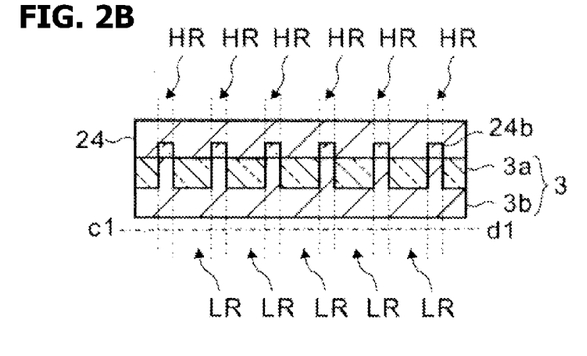
Figure 2C:
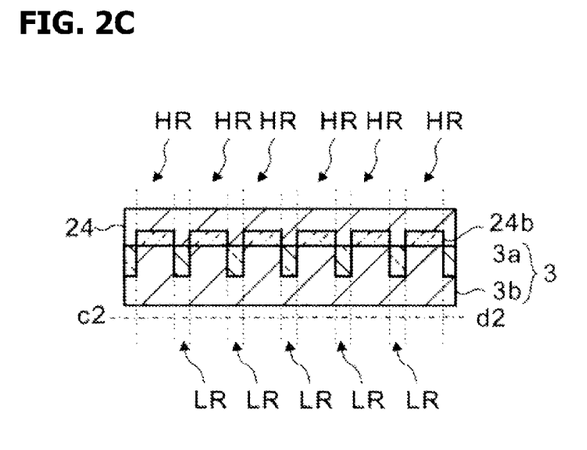

FIGS. 2A, 2B, and 2C illustrate the configuration of high resistivity regions HR and low resistivity regions LR, for establishing brightness grade or inclination according to a first embodiment.

As illustrated in FIG. 2A, high resistivity regions HR and low resistivity regions LR are alternatingly disposed horizontally in such a manner that the horizontal total width of the high resistivity regions HR decreases from the top to the bottom, while the horizontal total width of the low resistivity regions LH increases from the top to the bottom. Therefore, the average resistivity decreases from the top to the bottom. Each width of the high and low resistivity region is set so small that the people does not sense the respective width, but senses only the average value. In the first embodiment, the high resistivity region HR is formed by selectively irradiating the p-type layer 24 with plasma of an inert gas, using transparent electrode pattern as a mask.

FIGS. 2B and 2C depict horizontal cross sectional structures along segments at different vertical heights, c1-d1 and c2-d2 denoted in FIG. 2A. A transparent electrode layer made of ITO is formed on a surface of the p-type GaN layer 24 and patterned in such a manner that the ITO patterns 3a cover the regions which will form low resistivity regions LR. The width of the ITO pattern 3a illustrated in FIG. 2B (along c1-d1, at a lower position in FIG. 2A) is wider than that of the ITO pattern 3a illustrated in FIG. 2C (along c2-d2, at a higher position in FIG. 2A). The patterning of the ITO layer may be done by wet etching using photoresist mask. The patterned ITO layer will be subjected to thermal annealing in oxygen containing atmosphere.

The surface of the p-type GaN layer 24 exposed between pairs of the adjacent ITO patterns 3a is subjected to irradiation of plasma of an inert gas to form plasma damaged regions 24b which will constitute high resistivity regions HR. A reflecting metal electrode 3b such as Ag or Ag alloy layer is formed on the p-type GaN layer 24 covering the ITO patterns 3a.

The plasma damaged regions 24b form the high resistivity regions HR of contact resistance of the order of $1\times10^{-2}$ $\Omega$cm, while the p-type GaN layer covered with the ITO patterns may form low resistivity regions LR of contact resistance of the order of $1\times10^{-5}$ $\Omega$cm. Practically, it may be approximated that current flowing through the high resistivity regions is negligibly small compared to current flowing through the low resistivity regions.

The contact and wiring electrodes 8 on the n-type GaN layer 22 may be located at the center of the high resistivity regions HR. In such case, the high resistivity regions HR may serve to diffuse the current supplied from the contact and wiring electrodes 8. Description will be made on the processes for manufacturing LED array with brightness grade or inclination.

Figure 3A:
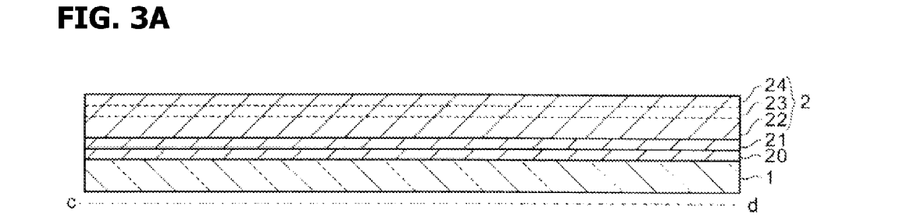
FIGS. 3A-3N are cross sections of semiconductor structure illustrating processes for forming an LED array.

As depicted in FIG. 3A, a growth substrate (for example, a C plane sapphire substrate) 1 capable of growing $Al_xGa_yIn_zN$ ($0 \leq x \leq 1$, $0 \leq y \leq 1$, $0 \leq z \leq 1$, $x+y+z=1$) by organic metal chemical vapor deposition (MOCVD) is prepared. Semiconductor lamination structure comprising $Al_xGa_yIn_zN$ ($0 \leq x \leq 1$, $0 \leq y \leq 1$, $0 \leq z \leq 1$, $x+y+z=1$) layers 20, 21, and 2 is grown on the growth substrate 1 by MOCVD.

More specifically, the sapphire substrate 1 is loaded in a MOCVD system, and heating (thermal cleaning) is done, for example, at 1000° C. for 10 minutes in hydrogen atmosphere. Then, a low temperature buffer layer (GaN layer) 20 is grown at a low temperature, for example at about 500° C., by supplying TMG (tri-methyl-gallium) 10.4 micromol/min, $NH_3$ 3.3 SLM (standard liter per minute), for three minutes. The growth substrate 1 is a single crystal substrate having lattice constant capable of epitaxially growing GaN series layers, for example a C-plane sapphire substrate. The growth substrate is selected from the materials transparent for the light at the wavelength of 362 nm, which is the absorption edge of the GaN, for enabling removal of the substrate by laser lift-off. Spinel, SiC, ZnO etc. may also be used as well as sapphire.

Then, the substrate 1 is heated to 1000° C. and maintained thereat for 30 seconds to crystallize the low temperature buffer layer 20. At the same temperature, an underlying GaN layer (undoped GaN layer) 21 is grown to a thickness of about 5 micrometers by supplying TMG 45 micromol/min, $NH_3$ 4.4 SLM for 100 minutes. Commonly, the undoped GaN layer is grown to a thickness in a range of 1-3 micrometers.

Continuously at 1000° C., a Si-doped n-type GaN layer 22 is grown to a thickness of about 5 micrometers by supplying TMG 45 micromol/min, $NH_3$ 4.4 SLM, and $SiH_4$ $2.7 \times 10^{-9}$ micromol/min, for 100 minutes.

Then, an active layer 23, more specifically multi-quantum-well (MQW) structure, is grown at 700° C. Here, an InGaN/GaN lamination is set as one period, and growth of 5 periods is performed. In one period, an InGaN well layer of a thickness of about 2.2 nm is grown by supplying TMG 3.6 micromol/min, TMI (tri-methyl-indium) 10 micromol/min, and $NH_3$ 4.4 SLM, for 33 seconds, and a GaN barrier layer of a thickness of about 15 nm is grown by supplying TMG 3.6 micromol/min, and $NH_3$ 4.4 SLM, for 320 seconds.

Then, a p-type layer 24, more specifically combination of a Mg-doped p-type AlGaN layer (clad layer) and a Mg-doped p-type GaN layer (contact layer), is grown. $Ga_{1-x-y}Al_xIn_yN$ may be called "GaN series".

Namely, after the growth of the active layer 23, the temperature is raised to 870° C., and a Mg-doped p-type AlGaN layer (clad layer) is grown to a thickness of about 40 nm by supplying TMG 8.1 micromol/min, TMA (tri-methyl-aluminium) 7.5 micromol/min, $NH_3$ 4.4 SLM, and $Cp_2Mg$ (bis-cyclopentadienyl Mg) $2.9 \times 10^{-7}$ micromol/min for 5 minutes. Then, a Mg-doped p-type GaN layer (contact layer) is grown to a thickness of about 150 nm by supplying TMG 18 micromol/min, $NH_3$ 4.4 SLM, and $Cp_2Mg$ $2.9 \times 10^{-7}$ micromol/min for 7 minutes.

In the p-type layer 24, the doped impurity Mg forms bond with hydrogen introduced in the film in the growth step to form Mg—H bond which cannot serve as p-type impurity. The Mg doped p-type layer has high resistivity. Activation process is done for expelling hydrogen from the layer 24. More specifically, heating at or above 400 degrees centigrade in vacuum or inert gas atmosphere is done using a heating furnace.

Figure 3B:
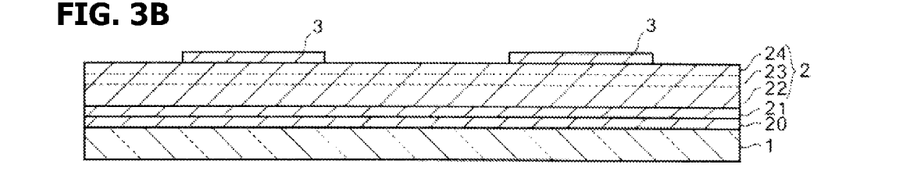

As depicted in FIG. 3B, a p-side electrode (reflecting electrode) 3 of predetermined shape is formed on the surface of the p-type GaN series layer 24. The p-side electrode 3 may comprise a patterned contact layer 3a of indium tin oxide (ITO) and a continuous Ag or Ag alloy layer 3b covering the patterned ITO layer 3a, as illustrated in FIGS. 2B and 2C. Here, the formation of the p-side electrode 3 is accompanied with formation of high resistivity region and low resistivity region, which will be described referring to FIGS. 4A-4F.

Figure 4A:
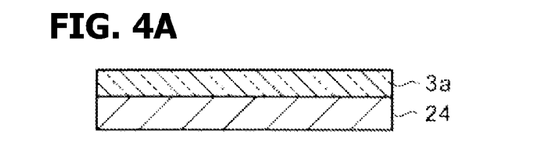
FIGS. 4A-4F are cross sections of semiconductor structure illustrating processes for forming brightness grade producing structure according to a first embodiment.

As depicted in FIG. 4A, an ITO film 3a is deposited on a surface of the p-type GaN layer 24 to a thickness of 15 nm by sputtering an ITO target under the conditions of Ar: 50 sccm, $O_2$: 0.5 sccm, and pressure: 0.5 Pa.

Figure 4B:
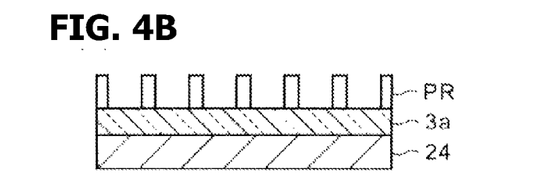

As depicted in FIG. 4B, a photo-resist mask PR of desired shape is formed on the ITO film 3a.

Figure 4C:
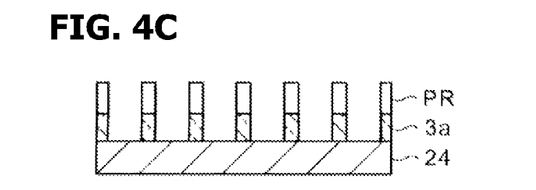

As depicted in FIG. 4C, the ITO film 3a is wet etched using the photo-resist mask PR as an etching mask to leave patterned ITO film 3a on the surface of the p-type GaN layer 24. Since the ITO film has not been subjected to thermal treatment in oxygen containing atmosphere, unnecessary portion of the ITO film can be completely removed.

Figure 4D:
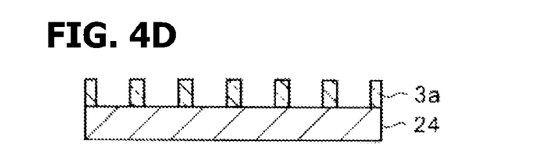

As depicted in FIG. 4D, the photo-resist mask PR is removed. After removing the photo-resist mask PR, the ITO film 3a is subjected to anneal treatment in oxygen containing atmosphere at a temperature between 400° C. and 700° C. (preferably between 450° C. and 600° C.). Contact resistance and transparency of the ITO film 3a are improved by the ITO anneal treatment.

Figure 4E:
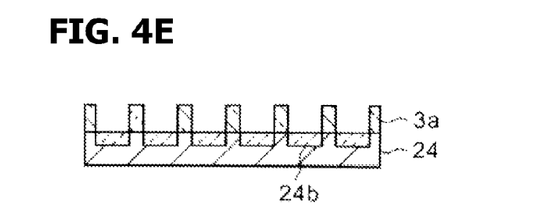

As depicted in FIG. 4E, the surface regions of the p-type GaN layer 24 exposed between (or outside) the ITO film patterns are irradiated by plasma of an inert gas, to form high resistivity regions 24b in which current is hard to flow. As the inert gas, Ar, He, $N_2$, $CF_4$, and $H_2$ can be used. The contact resistance of the p-type GaN layer may be $1 \times 10^{-5}$ $\Omega cm^2$. The contact resistance of the plasma-irradiated region can be arranged to be higher than $1 \times 10^{-2}$ $\Omega cm^2$, where current is practically hard to flow. The thickness of the high resistivity region is selected to be less than the thickness of the p-type GaN layer 24.

Figure 4F:
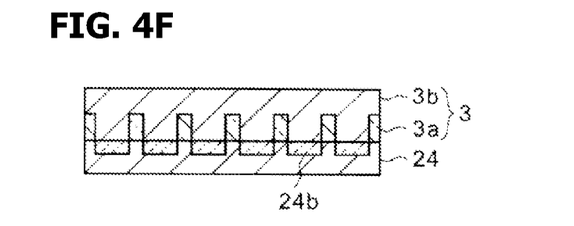

As depicted in FIG. 4F, an Ag layer 3b is deposited to a thickness of about 200 nm to continuously cover the ITO film 3a and the high resistivity regions 24b, by electron beam (EB) deposition. As a result, a reflection electrode 3 comprising the ITO film 3a and the reflecting metal (Ag) film 3b is formed. The reflecting electrode 3 has high reflectivity at the emission wavelength, and reflects light coming from the active layer 23 through the p-type layer 24 back toward the n-type layer 22. If the Ag layer is too thin, sufficient reflectivity cannot be obtained. Thus, the Ag layer preferably has a thickness of 100 nm or thicker. The formation of the reflection metal layer can also be done by sputtering. The reflection electrode may also be patterned by well-known lift-off. The reflection electrode 3 may also be formed of Pt, Pd, Ni, Ti, Al, and alloys thereof, as well as Ag.

The ITO film 3a serves as a contact layer and has low contact resistance. The region where the ITO film is formed constitutes low resistivity region LR. The plasma damaged region 24b has high contact resistance and constitutes high resistivity region HR. Electric current supplied from the electrode 8 selectively flows through the low resistivity region LR. The low resistivity region LR produces higher brightness than the high resistivity region HR. Planar distribution of the low resistivity region LR and the high resistivity region HR as depicted in FIG. 2A will produce brightness change which gradually increases from the lower side to the upper side. Now description continues referring to FIGS. 3C-3N.

Figure 3C:
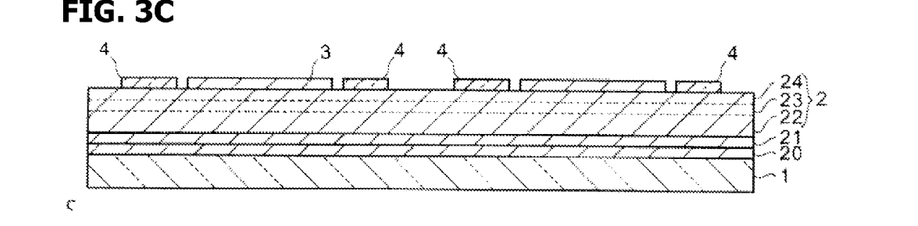

As depicted in FIG. 3C, an etching stopper layer 4 made of $SiO_2$ preferably of a same thickness as the reflection electrode 3 is formed on the device structure lamination 2 (p-type GaN layer 24) surrounding the reflection electrode 3, by sputtering and lift-off. The etching stopper layer 4 serves as an etch stopper in the etching step as described later referring to FIGS. 3L and 3M.

Figure 3D:
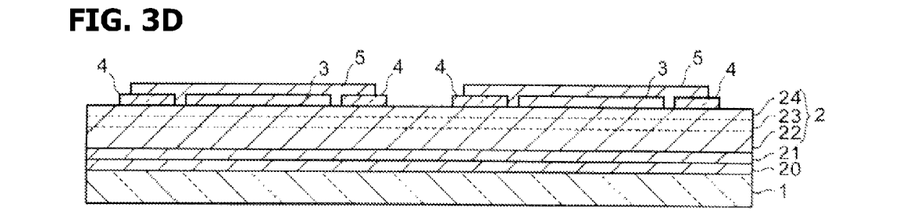

As depicted in FIG. 3D, a first adhesion layer 5 made of an Au film of 200 nm thick is formed on a region including the reflection electrode 3 and the etching stopper layer 4. The first adhesion layer 5 may be formed after a diffusion preventing layer is formed on the area including the reflection electrode 3 and the etching stopper layer 4. In case of forming a diffusion preventing layer, for example, a diffusion preventing layer made of a TiW film of 300 nm thick is formed by sputtering. The diffusion preventing film serves to prevent diffusion of a material used as the reflection electrode 3. When Ag is included in the reflection electrode, those materials as Ti, W, Pt, Pd, Mo, Ru, Ir, Au, and alloys thereof can be used.

Figure 3E:
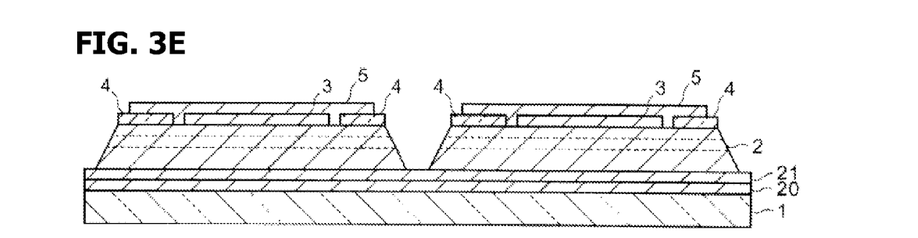

As depicted in FIG. 3E, the device structure lamination 2 is divided into a plurality of rectangular elements (see FIG. 1A) by dry etching using a resist mask and chlorine gas. Side walls of the divided device structure lamination 2 take forward taper shape with respect to the growth substrate, the angle between the side wall and the bottom surface of the element being less than 90 degrees.

Figure 3F:
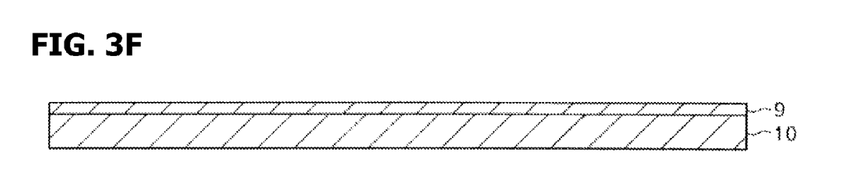

As depicted in FIG. 3F, a support substrate 10, for example made of silicon, is prepared. Thermal oxidation is done on the support substrate to form a thermal oxide insulating film 9. The thickness of the insulating film 9 is enough if sufficient insulation is secured.

A second adhesion layer 6 made of AuSn (Sn: 20 wt %) having a thickness of 1 micrometer is formed on the support substrate 10 by resistance heating. The support substrate 10 is preferably formed of a material having a thermal expansion coefficient near those of sapphire ($7.5 \times 10^{-6}$/K) and GaN ($5.6 \times 10^{-6}$/K), and a high thermal conductivity. For example, Si, AlN, Mo, W, CuW etc. may be used. The first adhesion layer 5 and the second adhesion layer 6 may be formed of metals including Au—Sn, Au—In, Pd—In, Cu—In, Cu—Sn, Ag—Sn, Ag—In, Ni—Sn, etc. capable of melt adhesion, or metals including Au capable of diffusion adhesion.

Figure 3G:
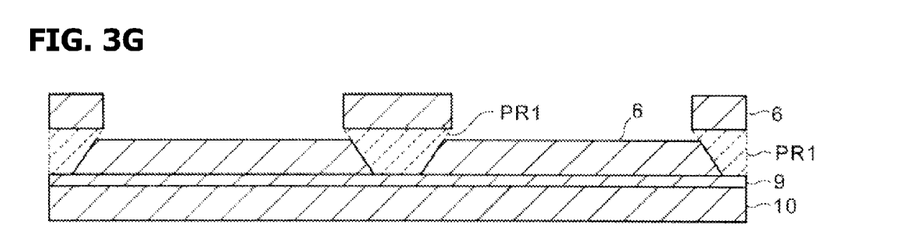

As depicted in FIG. 3G, the second adhesion layer 6 may be patterned by utilizing lift-off. First, a photoresist (for example photoresist AZ5200 available from Clariant Co.) is coated on a whole surface of a thermally oxidized support substrate 10, and is subjected to prebaking on a hot plate set under 90° C., for about 90 seconds in air. Then, the photoresist layer is pattern-exposed to ultraviolet (UV) lights at first exposure amount of 17 mJ. The photoresist film after the exposure is subjected to reversal baking treatment in air at 120° C., for 90 seconds to cause thermal cross-linking. Then, UV lights are irradiated on the whole surface of the support substrate 10 at reversal exposure amount 600 mJ. Then, the photoresist film is immersed in developing liquid for 130 seconds to perform developing, to obtain desired photo-resist mask PR1 (in areas except the area of the second adhesion layer 6). The photo-resist mask PR1 thus formed has peripheral portion with reverse taper shape (upwardly broadening shape). The resist material and the conditions of photolithography can be changed appropriately.

Figure 3H:
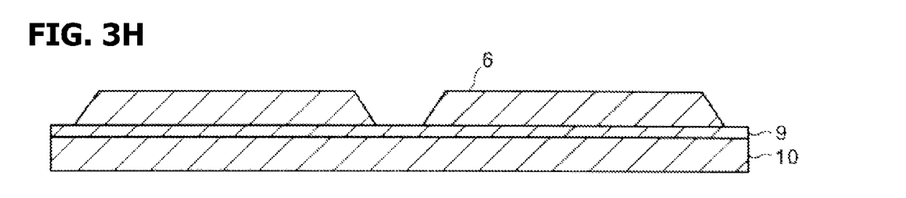

A metal lamination 6 comprising Ti (150 nm)/Ni (50 nm)/Au (100 nm)/Pt (200 nm)/AuSn (1000 nm, Sn: 20 wt %) is deposited on the support substrate by resistance heating, and subjected to lift-off to leave a second adhesion layer 6 having a forwardly tapered peripheral shape with respect to the support substrate 10 (upwardly narrowing cross section), as depicted in FIG. 3H.

The above-described process of manufacturing the adhesion layer 6 is not limitative. The lamination structure of the adhesion layer may be changed. The second adhesion layer 6 may also be patterned by dry etching or wet etching, as well as lift-off.

Figure 3I:
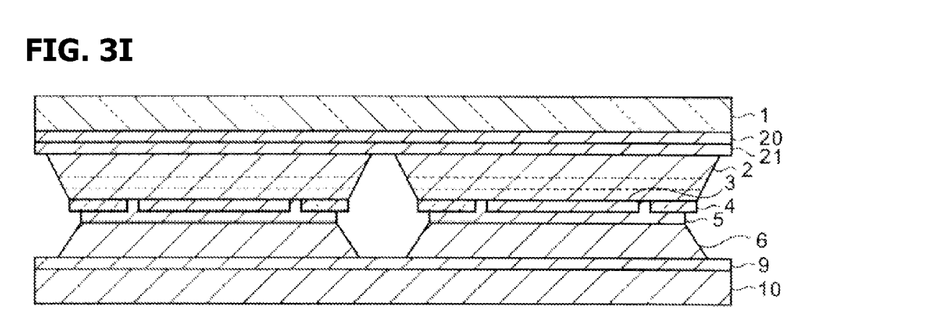

As depicted in FIG. 3I, the first adhesion layer 5 and the second adhesion layer 6 are brought into pressed contact with a pressure of 3 MPa, are heated to 300° C., maintained for 10 minutes, and then cooled down to room temperature, achieving melt adhesion. An adhesion layer is formed by this melt adhesion.

Figure 3J:
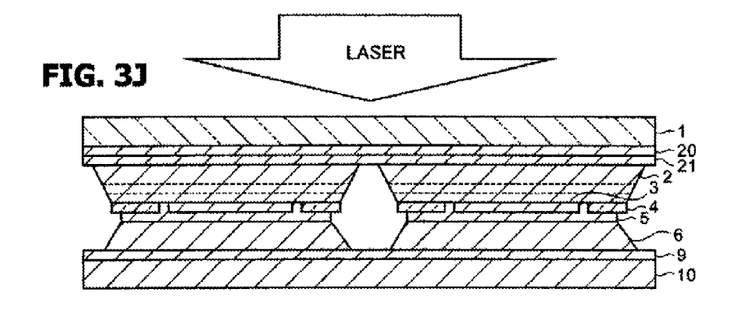

As depicted in FIG. 3J, UV excimer laser lights are irradiated from the rear surface side of the sapphire substrate 1, to heat and decompose the buffer layer 20. The sapphire substrate 1 is separated (removed) from the device structure lamination 2 by laser lift-off. KrF excimer laser emitting lights of wavelength 248 nm may be used as the laser. Laser power may be about 800 mJ/cm$^2$. Removal of the growth substrate 1 may also be done by other methods than laser lift-off, such as etching.

Figure 3K:
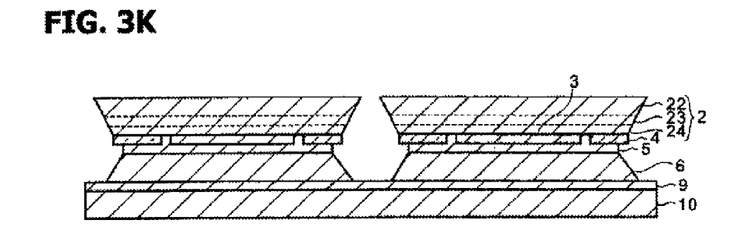

As depicted in FIG. 3K, metal Ga generated by laser lift-off is removed by hot water etc., and surface treatment with chloric acid is done. The surface of the n-type GaN layer 22 is exposed by these treatments. The surface treatment is enough if it can etch nitride semiconductor. Acidic and alkaline agents such as phosphoric acid, sulfuric acid, KOH, NaOH, etc. can be used. Surface treatment may be also done by dry etching using Ar plasma or chlorine series plasma, or by polishing. The surface of the n-type semiconductor layer 22 may be subjected to Cl or Ar treatment using dry etching apparatus such as RIE apparatus, or may be planarized by polishing using chemical mechanical polishing (CMP) apparatus, to remove laser traces or laser-damaged layers. Further, the exposed surface of the n-type semiconductor layer 22 may be subjected to micro-cone (surface structure) process which improves light output efficiency.

Figure 3L:
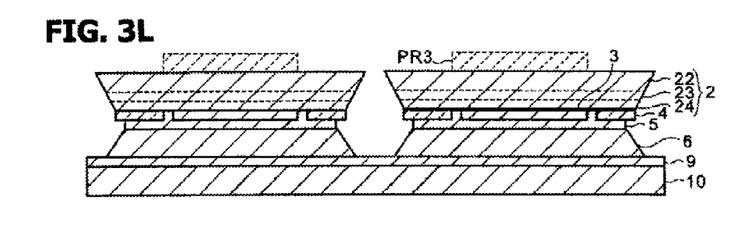

As illustrated in FIG. 3L, a photo-resist mask PR3 is formed which exposes peripheral portions of the device structure lamination 2. Subsequently, dry etching is carried out using chlorine gas to etch the peripheral portions of the device structure lamination 2 that are not covered by the photo-resist mask PR3, until the etching stop layer 4 is exposed.

Figure 3M:
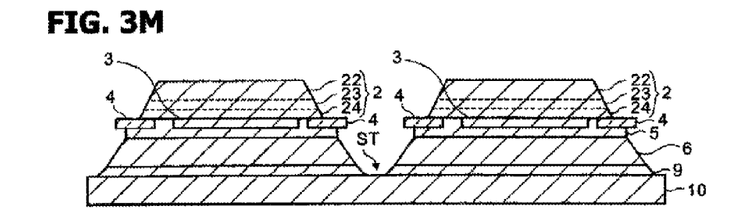

As illustrated in FIG. 3M, the side wall of the device structure lamination 2 has a forwardly tapered shape in which the planar cross section of the device structure lamination 2 decreases towards the top, assuming the support substrate 10 being located at the bottom. In this process, the insulating film 9 on the surface of the support substrate 10 is also etched to have forward taper using the etching stopper layer 4 as a mask. Forwardly tapered shape is free from overhanging or vertical side surface. The existence of the etching stopper layer 4 can increase the reliability of the device. The etching stopper layer 4 protects the underlying adhesion layer to be erroneously etched and produced deposition causing short-circuit.

Figure 3N:
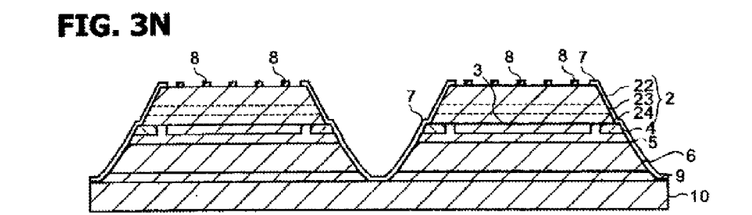

As illustrated in FIG. 3N, a protection film (insulation film) 7 made of SiO$_2$ is formed by, for example, chemical vapor deposition (CVD) to cover the entire upper surface of the element formed in the aforementioned steps, and then part of the protection film 7 formed on the device structure lamination 2 is etched with buffered hydrofluoric acid to expose part of the surface of the device structure lamination 2 (surface of the n-type GaN layer 22 exposed by peeling off the transparent substrate 1).

A photo-resist mask is formed, and a Ti layer of a thickness of 1 nm, an Al layer of a thickness of 200 nm, a Ti layer of a thickness of 100 nm, a Pt layer of a thickness of 200 nm, and an Au layer of a thickness of 2.5 µm are sequentially deposited in this order by electron beam deposition and patterned by lift-off to form wiring/electrode 8 having, for example, a width of about 10 µm, the wiring 8 electrically connecting the n-type GaN layer 22 and the p-side electrode 12 of the adjacent element. The wirings 8 form Ohmic contact with the upper surface of the n-type GaN layer 22, and continuously extend on the tapered side walls of the device structure lamination 2 and the adhesion layers 5 and 6 through the insulating film 7. Since the wirings 8 are formed on flat surfaces or forwardly tapered side walls, they can be formed without causing disconnection during and after manufacture. The wiring 8 preferably has a width of 20 µm or lower and 3 µm or higher.

Figure 9:
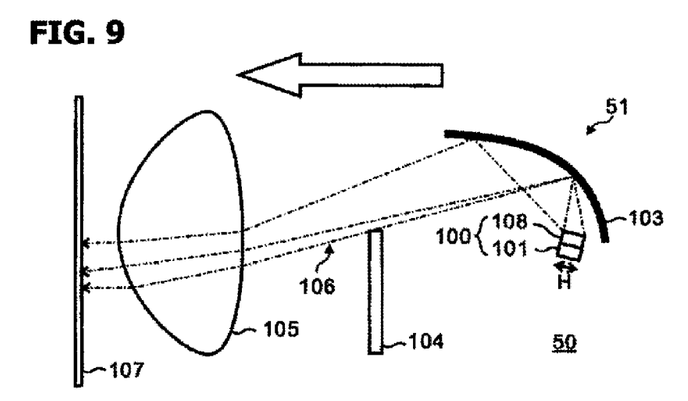
FIG. 9 is a schematic diagram illustrating a head light assembly.

Then, the support substrate 10 may be divided by laser scribing or dicing. Finally, fluorescent material is coated on the surface of the LED array 100, to form the fluorescent layer 108 as depicted in FIG. 9. For example, resin containing yellow fluorescent particles is coated on blue GaN LED elements to form the fluorescent layer 108.

In the above embodiment, crystal growth is done in the order of n-type layer/active layer/p-type layer, and high resistivity regions are formed in the p-type layer. The crystal growth may be done in the order of p-type layer/active layer/n-type layer, and high resistivity regions may be formed in the n-type layer. At least one of the p-type layer and the n-type layer may be used to form high resistivity regions. A plurality of nitride semiconductor light emitting (LED) elements 101 are disposed on a single support substrate 10, and connected in series to constitute an LED array 100. The LED elements may be connected in parallel instead, or may be separated individually.

Figure 5:
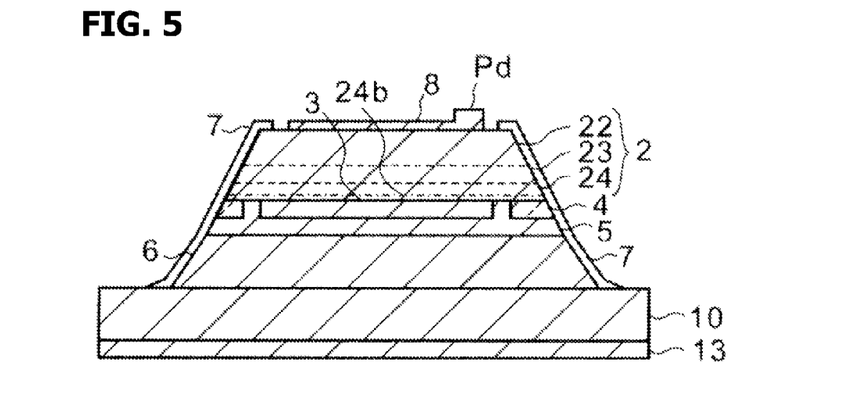
FIG. 5 is a cross section of a semiconductor structure according to a modification.

FIG. 5 illustrates an alteration structure. An electrode 13 is formed on a rear surface of a conductive support substrate 10. Electrode 8 is formed on the surface of the n-type GaN layer 22 and is connected to an electrode pad Pd also formed on the upper surface of the n-type GaN layer 22. Current is supplied between the pad Pd and the electrode 13. Other structures including the low resistivity region and the high resistivity region are similar to the foregoing embodiment.

FIGS. 6A-6E illustrate processes of the second embodiment, to replace the processes illustrated in FIGS. 4A-4F of the first embodiment. Other points are similar to the first embodiment.

Figure 6A:
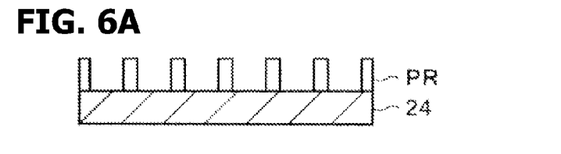
FIGS. 6A-6E are cross sections of semiconductor structure illustrating processes for forming brightness grade producing structure according to a second embodiment.

As illustrated in FIG. 6A, a photo-resist mask PR of predetermined pattern (configuration) corresponding to low resistivity regions is formed on a p-type GaN layer 24 of a device structure lamination. The region(s) covered by the photo-resist mask will form low resistivity region(s), and the regions exposed outside the photo-resist mask will form high resistivity regions.

Figure 6B:
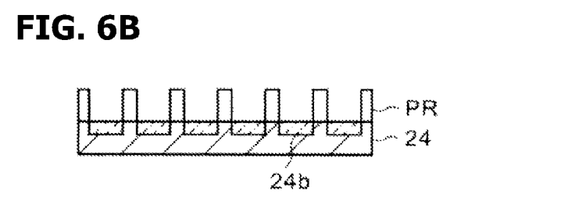

As illustrated in FIG. 6B, gas plasma GP of an inert gas is excited and is irradiated on the p-type GaN layer 24 of the device structure lamination. The p-type GaN layer 24 outside the photo-resist mask PR is exposed to the gas plasma GP, influenced by the gas plasma GP, and is transformed into plasma damaged region 24b. The p-type GaN layer 24 under the photo-resist mask PR is protected by the mask PR from the plasma attack. The region irradiated by the plasma will form high resistivity region HR having a contact resistance of, for example $1\times10^{-2}$ $\Omega$cm$^2$ or above. The thickness of the high resistivity region HR is set thinner than the thickness of the p-type GaN layer 24. Gases such as Ar, He, $N_2$, $CF_4$, and $H_2$ may be used as the inert gas.

Figure 6C:
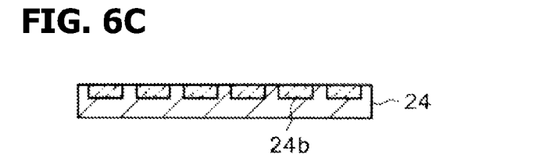

As illustrated in FIG. 6C, the photo-resist mask PR is removed. The whole surface of the p-type GaN layer 24 is exposed, wherein the high resistivity regions HR are selectively formed between the low resistivity regions LR.

Figure 6D:
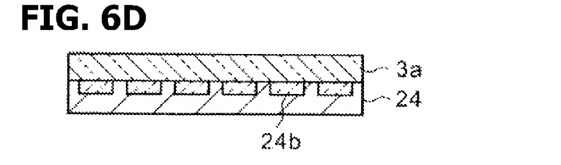

As illustrated in FIG. 6D, a transparent electrode layer 3a made of ITO is formed on the surface of the p-type GaN layer 24 including the high resistivity regions HR and low resistivity regions LR. For example, an ITO film 3a is sputtered in a sputtering apparatus under the conditions of Ar: 50 sccm, $O_2$: 0.5 sccm, and pressure: 0.5 Pa, to a thickness of 15 nm. The ITO film 3a is subjected to thermal treatment in an oxygen containing atmosphere at a temperature between 400° C. and 700° C. (preferably between 450° C. and 600° C.). Contact resistance and transparency of the ITO film are improved by the anneal treatment.

Figure 6E:
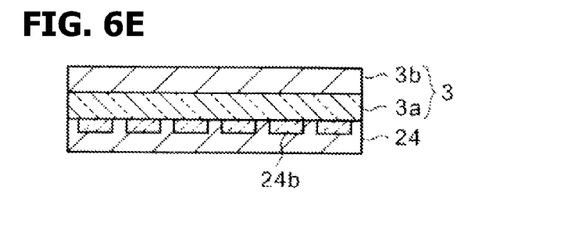

As illustrated in FIG. 6E, an Ag or Ag alloy film 3b is deposited on the ITO film 3a by electron beam deposition to a thickness of about 200 nm. The Ag reflecting metal film 3b and the ITO film 3a collectively constitute a reflecting metal electrode 3, which reflect lights emitted from the active layer 23 and coming from the lower side toward the downward direction. The reflecting metal film having high reflectivity to the emitted lights may also be formed of Pt, Pd, Ni, Ti, Al, and alloys thereof, as well as Ag. The Ag film preferably has a thickness of 100 nm or more, and may be formed by sputtering as well as by electron beam deposition.

The second embodiment as described above, selectively forms plasma damaged regions in predetermined areas of the p-type GaN layer 24, and after removing the mask for plasma irradiation, forms an ITO film 3a totally on the p-type GaN layer 24, and a reflecting metal film 3b is formed on the continuous surface of the ITO film 3a, above the p-type GaN layer 24. The combination of the ITO film 3a and the Ag or Ag alloy reflecting metal electrode 3b may be replaced with a combination of a thin Ni or NiO film and an Ag or Ag alloy film.

In the second embodiment, the plasma damaged regions 24b constitute high resistivity regions HR, and the ITO film 3a formed on p-type GaN regions other than the plasma damaged regions 24b serves as a contact layer and constitutes low resistivity regions LR. Currents supplied from the electrodes 8 are allowed to flow selectively through the low resistivity regions LR, producing higher brightness than that in the high resistivity regions HR.

When the low resistivity regions LR and the high resistivity regions HR are configured to distribute as in the plan view of FIG. 2A, brightness distribution gradually decreasing from the lower side to the upper side can be provided. Head lights of automobiles are required to illuminate near portions more brightly than far portions. The above-mentioned brightness distribution is fitted for a head light of an automobile.

FIGS. 7A-7D illustrate processes of the third embodiment, to replace the processes illustrated in FIGS. 4A-4F of the first embodiment. Other points are similar to the first embodiment.

Figure 7A:
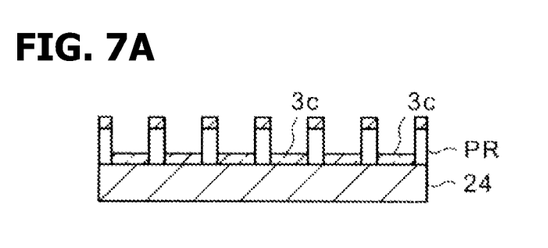
FIGS. 7A-7D are cross sections of semiconductor structure illustrating processes for forming brightness grade producing structure according to a third embodiment.

As illustrated in FIG. 7A, a photo-resist mask PR is formed on the surface of a p-type GaN layer 24. The mask PR has a pattern of low resistivity region LR, with openings corresponding to high resistivity regions HR, as illustrated in FIG. 2A. Then, a silicon oxide (transparent insulating) film 3c is deposited on the p-type GaN layer 24 partially covered by the photo-resist mask PR. In the openings of the photo-resist mask PR, the insulating film 3c is formed on the surface of the p-type GaN layer 24. The photoresist mask PR protects the underlying surface of the p-type GaN layer 24 from being directly covered by the insulating film 3c, and allows deposition of the insulating film 3c thereon.

Figure 7B:
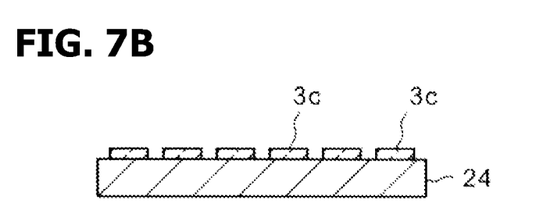

As illustrated in FIG. 7B, the photo-resist mask PR is removed, and the insulating film 3c deposited on the photo-resist mask PR is removed by lift-off to expose the surface of low resistivity regions LR. The insulating films 3c which have been formed in the openings of the photoresist mask (high resistivity regions) in contact with the p-type GaN layer 24 are left.

Figure 7C:
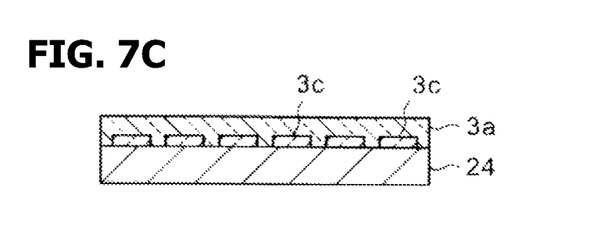

As illustrated in FIG. 7C, a transparent electrode layer 3a made of ITO is formed on the insulating film 3c and on the surface of the p-type GaN layer 24 outside the insulating film 3c (high resistivity regions HR). For example, an ITO film 3a is sputtered to a thickness of 15 nm in a sputtering apparatus under the conditions of Ar: 50 sccm, $O_2$: 0.5 sccm, and pressure: 0.5 Pa. The ITO film 3a is subjected to thermal treatment in an oxygen containing atmosphere at a temperature between 400° C. and 700° C. (preferably between 450° C. and 600° C.). Contact resistance and transparency of the ITO film are improved by the anneal treatment. The ITO film 3a in direct contact with the p-type GaN layer 24 will form contact layers of low contact resistance. The insulating films 3c between the ITO film 3a and the p-type GaN layer 24 constitute barriers for carrier transfer, and produce high resistivity regions HR.

Figure 7D:
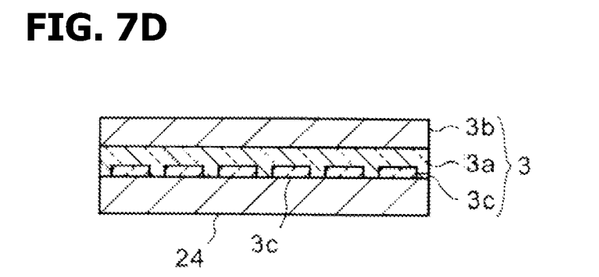

As illustrated in FIG. 7D, an Ag or Ag alloy film 3b is deposited on the ITO film 3a by electron beam deposition to a thickness of about 200 nm to form a reflecting metal film.

The Ag reflecting metal film 3b and the ITO film 3a collectively constitute a reflecting metal electrode 3, which reflects lights emitted from the active layer 23 and coming from the lower side.

The reflecting metal film 3 having high reflectivity to the emitted lights may also be formed of Pt, Pd, Ni, Ti, Al, and alloys thereof, as well as Ag. The Ag film preferably has a thickness of 100 nm or more, and may be formed by sputtering as well as by electron beam deposition. The combination of the ITO film 3a and the reflecting metal film 3b may be replaced with a combination of a thin Ni or NiO film and an Ag film.

In the third embodiment, regions where insulating films 3c are formed constitute high resistivity regions HR, and the ITO films 3a directly contacting the p-type GaN layer 24 outside the insulating films 3c serve as contact layers, constituting low resistivity regions LR. Currents supplied from the electrodes 8 are allowed to flow selectively through the low resistivity regions LR, producing higher brightness than that in the high resistivity regions HR.

FIGS. 8A-8D illustrate processes of the fourth embodiment, to replace the processes illustrated in FIGS. 4A-4F of the first embodiment. In the fourth embodiment, the resistivity of the p-type GaN layer 24 is changed along one direction by changing the degree of plasma damage. Other points are similar to the first embodiment.

Figure 8A:
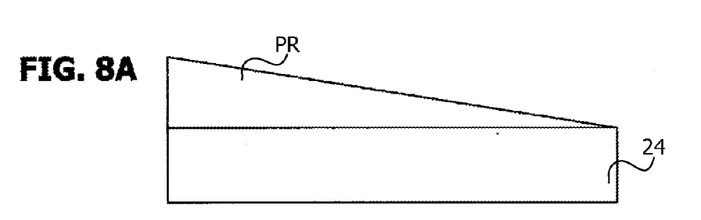
FIGS. 8A-8D are cross sections of semiconductor structure illustrating processes for forming brightness grade producing structure according to a fourth embodiment.

As illustrated in FIG. 8A, a photo-resist mask PR having a thickness changing in one direction, decreasing thickness from the left edge to the right edge, is formed on a p-type GaN layer 24. Such a photo-resist mask may be formed by exposing a photoresist layer with graded optical density and developing the exposed photo-resist layer. The photo-resist mask PR has property of being consumed by plasma irradiation.

Figure 8B:
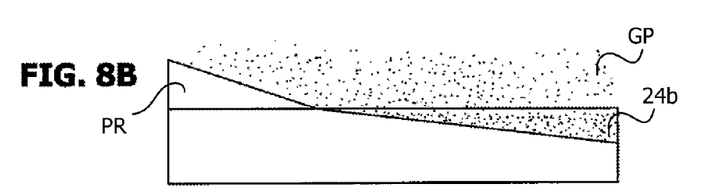

As illustrated in FIG. 8B, gas plasma GP of an inert gas is irradiated on the photo-resist mask PR. The photo-resist mask PR is consumed by plasma. Since the photo-resist mask PR has a thickness distribution changing in one direction, the photo-resist mask PR is consumed from a thinnest portion to gradually thicker portions to expose the underlying p-type GaN layer 24 gradually wider from the left edge in the figure. The portion exposed earlier will receive plasma attack longer, and will produce heavier plasma damage. The degree of plasma damage may appear in the degree of crystal damage or in the depth of damaged region. In the figure, depth of the plasma damaged region 24b represents the degree of plasma damage.

Figure 8C:
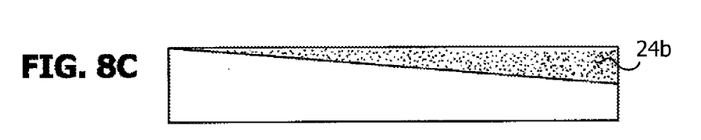

As illustrated in FIG. 8C, when the photo-resist mask PR is totally consumed, the plasma damaged region 24b is formed on the total surface area of the p-type GaN layer 24 with gradually changing degree of plasma damage. The area of heavier plasma damage will exhibit larger contact resistance.

Figure 8D:
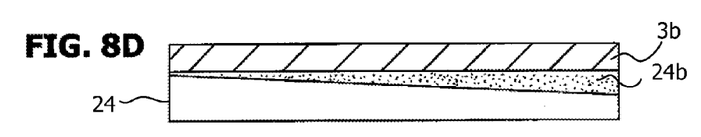

As illustrated in FIG. 8D, an Ag layer 3b is deposited on the p-type GaN layer 24 with plasma damaged regions 24b. The damage of the plasma damaged regions 24b becomes heavier and the contact resistance of the Ag layer 3b becomes larger, as the position shifts rightward, thereby establishing brightness distribution gradually increasing from the right edge to the left edge in the figure.

FIG. 9 is a diagram showing a structure of automotive lighting (headlamps) 50 equipped with the LED arrays 100 according to the embodiment of the present invention.

As shown in FIG. 9, a projection optical system 51 can be equipped with a multireflector (reflection surfaces) 103 and a projection lens 105, to share the projection lens 105 with a plurality of LED arrays 100. The headlamp 50 shown in FIG. 9 includes light sources formed of at least two LED arrays each having an LED array 101 and a fluorescent material layer 108 covering the LED array, and a projection optical system 51 including reflection surfaces 103 which are multi-reflectors divided into a plurality of small reflection regions, a shade 104 and a projector lens 105.

As depicted in FIG. 9, the light source is positioned to make its projecting direction (light emitting surface) upward. The reflection surface 103 is a spheroidal reflection surface whose first focal point is set near the light source and second focal point is set neat the upper edge of the shade 104, and it is positioned to cover the side and the front of the light source so that lights from the light source irradiate the reflection surface 103.

As depicted in FIG. 9, the reflection surface 103 projects the light source images 106 of the plurality of the LED arrays 100 of the light source to the front of a vehicle and is designed to project the light source images 106 of the LED arrays 100 on the virtual vertical screen (projection surface) 107 which faces the front of the vehicle.

The shade 104 is a shading part for shading a portion of reflected light from the reflection surface 103 to form a cutoff line suitable for a headlamp. The shade 104 is disposed between the projection lens 105 and the light source 102, placing its upper edge near the focal point of the projection lens 105.

The projection lens 105 is positioned on the front of the vehicle and irradiates the reflected light from the reflection surface 103 onto the projection surface 107.

When the low resistivity regions LR and the high resistivity regions HR are configured to distribute as in the plan view of FIG. 2A, brightness distribution gradually decreasing from the lower side to the upper side can be obtained. Head lights of automobiles are required to illumine near portions more brightly than far portions. The above-mentioned brightness distribution is fitted for head light of an automobile.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the invention have been described in detail, it should be understood that the various changes, substitutions, and alterations could be made hereto without departing from the spirit and scope of the invention.

What are claimed are:

1. A semiconductor light emitting device comprising:
    a semiconductor lamination including a p-type semiconductor layer, an active semiconductor layer, and an n-type semiconductor layer;
    an opposing electrode structure including a first electrode structure formed above the p-type semiconductor layer, and a second electrode structure formed above the n-type semiconductor layer; and
    a brightness grade producing structure including a surface layer of one of the p-type semiconductor layer and the n-type semiconductor layer and producing brightness of emitting light gradually changing from one edge to an opposite edge of a light output plane,
    wherein the brightness grade producing structure includes high resistivity regions including plasma damaged regions and low resistivity regions including regions of no plasma damage in the surface layer.

2. A semiconductor light emitting device comprising:
- a semiconductor lamination including a p-type semiconductor layer, an active semiconductor layer, and an n-type semiconductor layer;
- an opposing electrode structure including a first electrode structure formed above the p-type semiconductor layer, and a second electrode structure formed above the n-type semiconductor layer; and
- a brightness grade producing structure including a surface layer of one of the p-type semiconductor layer and the n-type semiconductor layer and producing brightness of emitted light gradually changing from one edge to an opposite edge of a light output plane,
- wherein the brightness grade producing structure includes a plasma damaged region in the surface layer, the plasma damaged region changing depth from one edge to an opposite edge of the light output plane.

3. The semiconductor light emitting device according to claim 2, further comprising an optical system for projecting lights emitted from the light output plane toward a predetermined direction.

4. A method for manufacturing a semiconductor light emitting device capable of emitting lights with graded brightness, the method comprising:
- growing a semiconductor lamination on a growth substrate, the semiconductor lamination including a p-type semiconductor layer, an active semiconductor layer, and an n-type semiconductor layer;
- forming a brightness grade producing structure including a surface layer of at least one of the p-type semiconductor layer and the n-type semiconductor layer and producing brightness of emitting light gradually changing from one edge to an opposite edge of a light output plane; and
- forming an opposing electrode structure including a first electrode structure formed above the p-type semiconductor layer, and a second electrode structure formed above the n-type semiconductor layer,
- wherein the forming the brightness grade producing structure includes forming high resistivity regions including plasma damaged regions and regions of no plasma damage in the surface layer.

5. A method for manufacturing a semiconductor light emitting device capable of emitting lights with graded brightness, the method comprising:
- growing a semiconductor lamination on a growth substrate, the semiconductor lamination including a p-type semiconductor layer, an active semiconductor layer, and an n-type semiconductor layer;
- forming a brightness grade producing structure including a surface layer of at least one of the p-type semiconductor layer and the n-type semiconductor layer and producing brightness of emitting light gradually changing from one edge to an opposite edge of a light output plane; and
- forming an opposing electrode structure including a first electrode structure formed above the p-type semiconductor layer, and a second electrode structure formed above the n-type semiconductor layer,
- wherein the forming the brightness grade producing structure includes forming a plasma damaged region in the surface layer, the plasma damaged region changing depth from one edge to an opposite edge of the light output plane.

6. The method according to claim 4, further comprising assembling an optical system for projecting lights emitted from the light output plane toward a predetermined direction.

7. The semiconductor light emitting device according to claim 2, further comprising an optical system for projecting lights emitted from the light output plane toward a predetermined direction.

8. The method according to claim 5, further comprising assembling an optical system for projecting lights emitted from the light output plane toward a predetermined direction.

* * * * *